United States Patent [19]
Murata

[11] Patent Number: 5,243,610
[45] Date of Patent: Sep. 7, 1993

[54] OPTICAL FIBER DISPERSION-COMPENSATING DEVICE

[75] Inventor: Shigeru Murata, Tokyo, Japan
[73] Assignee: NEC Corporation, Tokyo, Japan
[21] Appl. No.: 836,405
[22] Filed: Feb. 18, 1992

[30] Foreign Application Priority Data

Feb. 19, 1991 [JP] Japan .................. 3-24233

[51] Int. Cl.$^5$ .............................. H01S 3/10
[52] U.S. Cl. ....................... 372/21; 372/6;
   372/70; 372/18; 359/328; 385/122
[58] Field of Search ............... 372/21, 22, 18, 69,
   372/70; 359/328; 385/122

[56] References Cited

U.S. PATENT DOCUMENTS

| | | | |
|---|---|---|---|
| 4,880,996 | 11/1989 | Peterson et al. | 372/21 |
| 4,910,738 | 3/1990 | Fujita et al. | 372/18 |
| 5,138,621 | 8/1992 | Goto et al. | 372/69 |
| 5,140,456 | 8/1992 | Huber | 372/6 |

FOREIGN PATENT DOCUMENTS

57-85281 5/1982 Japan.
57-89703 6/1982 Japan.
63-103215 5/1988 Japan.

OTHER PUBLICATIONS

Yariv et al, "Compensation For Channel Dispersion By Nonlinear Optical Phase Conjugation", Optics Letters, vol. 4, No. 2, Feb. 1979, pp. 52-54.
Provost et al, "Cavity-Enhanced Highly Nondegenerate Four-Wave Mixing In GaAlAs Semiconductor Lasers", Applied Physics Letters, vol. 55, No. 6, Aug. 1989, pp. 519-521.
Favre et al, "Contradirectional Four-Wave Mixing In 1.51 μm Near-Travelling-Wave Semiconductor Laser Amplifier", Electronics Letters, vol. 25, No. 16, Aug. 1989, pp. 1053-1055.
Murata et al, "THz Optical-Frequency Conversion of 1GB/s-Signals Using Highly Nondegenerate Four--Wave Mixing In An InGaAsP Semiconductor Laser", IEEE Transactions Photonics Technology Letters, vol. 3, No. 11, Nov. 1991, pp. 1021-1023.

*Primary Examiner*—Leon Scott, Jr.
*Attorney, Agent, or Firm*—Leydig, Voit & Mayer

[57] ABSTRACT

A stable optical fiber dispersion-compensating device reduces electrical power consumption and compensates for wave deterioration due to dispersion of high speed signals having a frequency of several Gb/s or above. The devices includes a non-linear optical medium, a pump laser for generating pump light, means for injecting input signal light and the pump light into the non-linear optical medium, means for taking out output signal light which is frequency converted and is generated from the non-linear optical medium by non-degenerate four-wave mixing. The non-linear optical medium is a Fabry-Perot semiconductor laser, and the frequencies of the pump light and input signal light respectively substantially coincide with one of different resonant modes of the Fabry-Perot semiconductor laser.

7 Claims, 6 Drawing Sheets

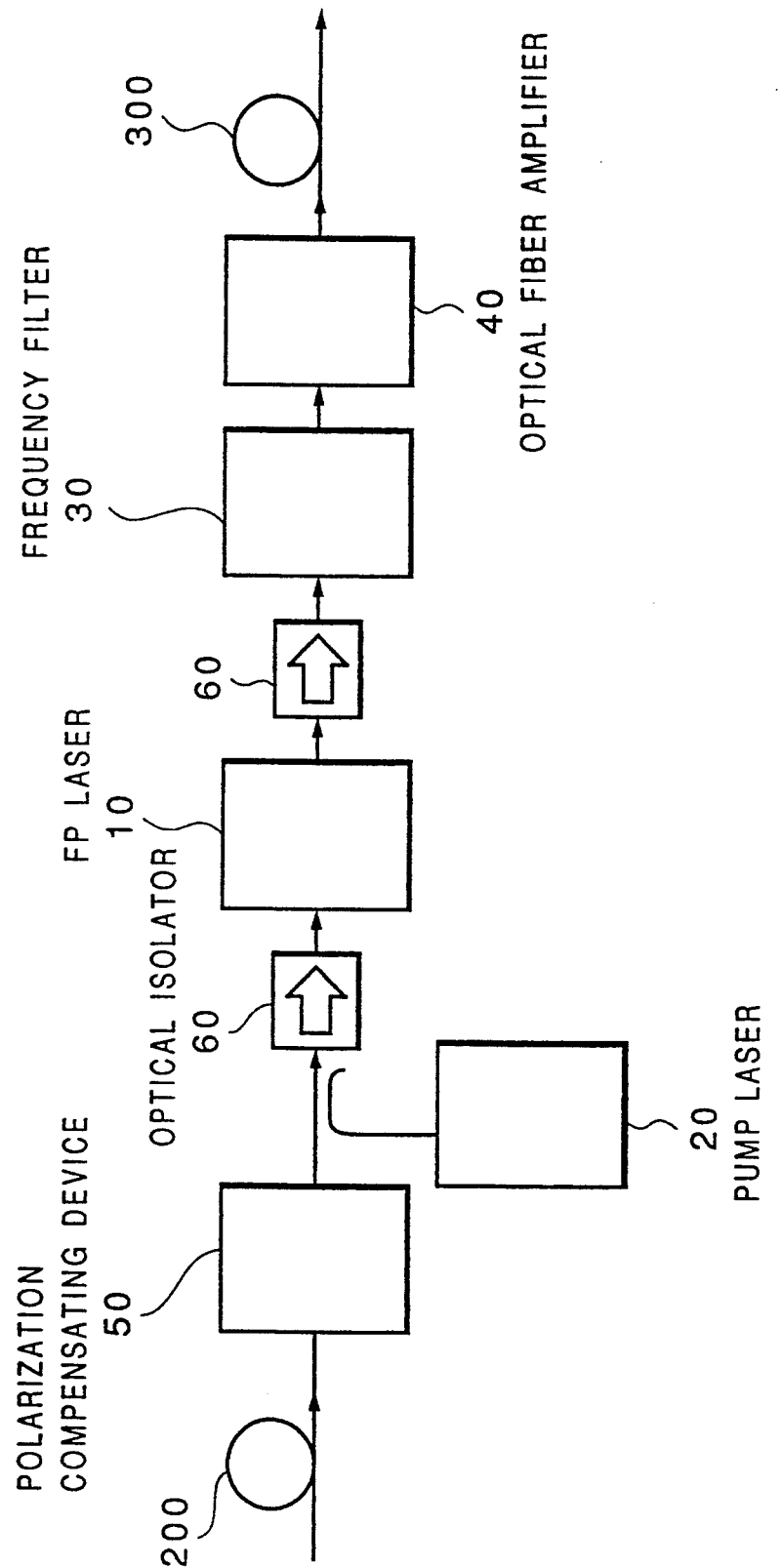

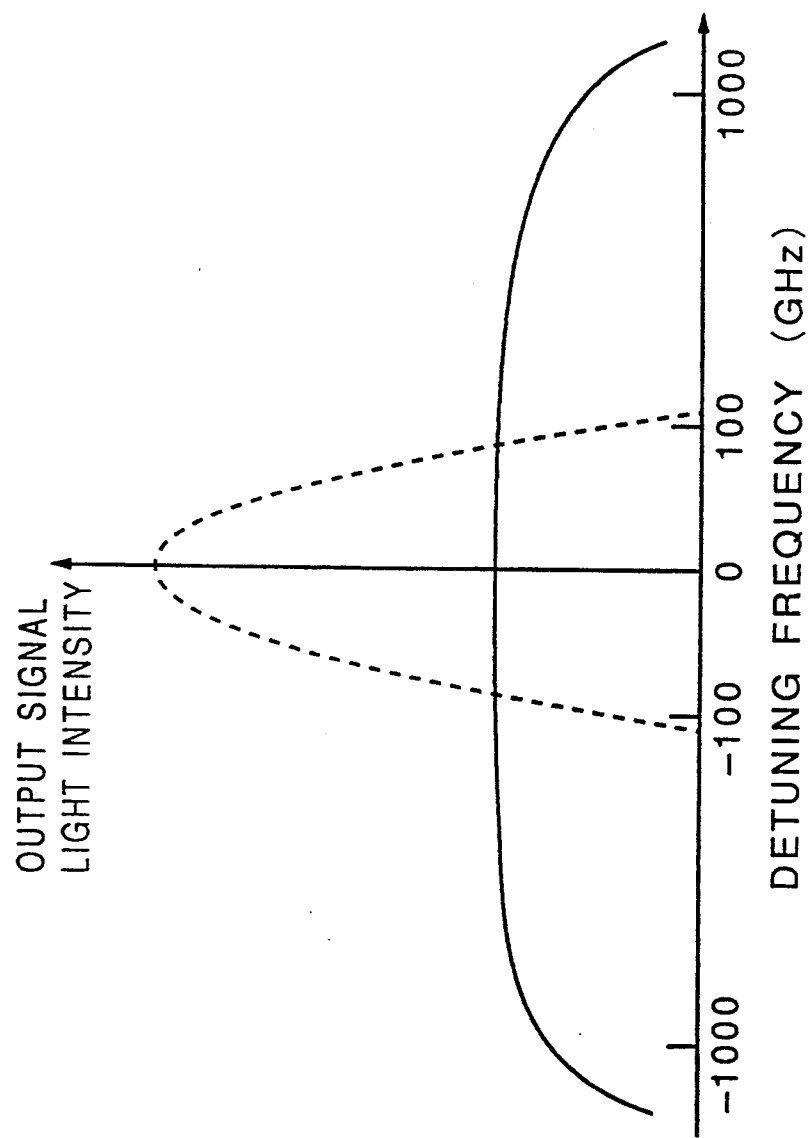

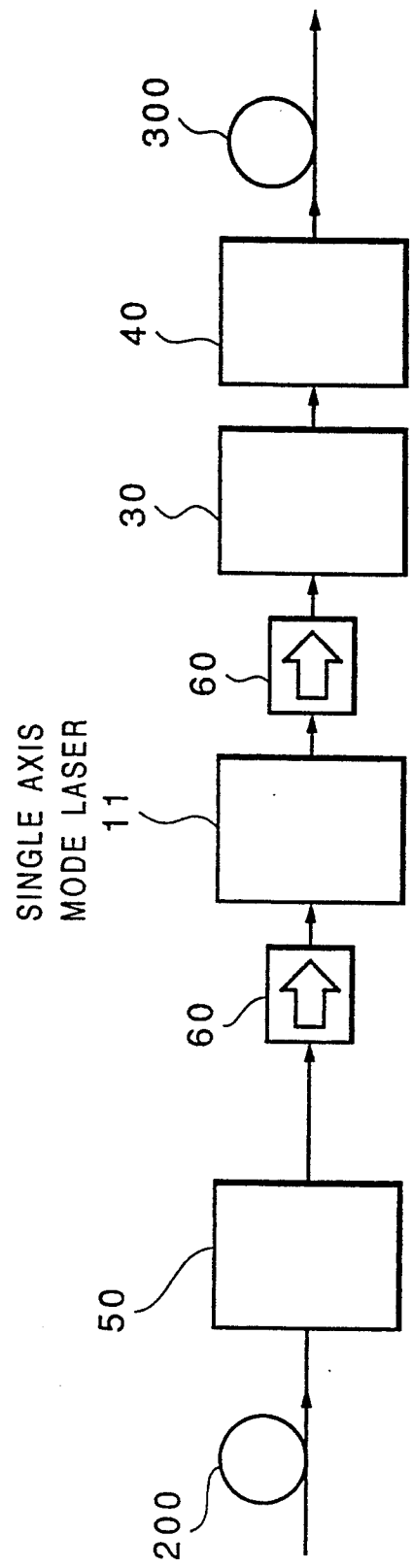

OPTICAL FIBER DISPERSION-COMPENSATING DEVICE

BACKGROUND OF THE INVENTION

The present invention relates to an optical fiber-dispersive compensating device utilizing non-degenerate fourwave mixing of a semiconductor laser.

In optical fiber communication, larger transmission speed and transmission distance of signals cause deterioration of signal waves due to frequency dispersion of a signal in an optical fiber forming a transmission path. This results in limiting the transmission speed or distance. For example, for the transmission of a light signal at 10 Gb/s using a 1.55 $\mu$m wavelength signal using an ordinary 1.3 $\mu$m zero-dispersion fiber, transmission distance is limited to several tens of km or less due to secondary frequency dispersion.

Several methods are available for compensating for the frequency dispersion. One of the most useful of these methods is a dispersive compensating method utilizing a non-linear optical effect since its compensation may be effected theoretically free of transmission distance to be compensated. In this method, a dispersion-compensating device containing a non-linear optical element is provided at the intermediate point of a transmission path having substantially uniform frequency dispersion. In the dispersion-compensating device, the spectrum of signal light deteriorated by transmitted frequency dispersion is frequency-converted about a frequency axis and fed back into the transmission path on the receiving side. This may compensate for frequency dispersion of the first half of the transmission path. For example, due to frequency dispersion of the optical fiber, higher frequency components of signal light may travel faster than lower frequency components. In this process, the signal waveforms deteriorate as the length of propagation in the optical fiber increases. If the frequency conversion of signal light as hereinbefore described is performed at the intermediate point on the transmission path, lower frequency components of signal light before conversion are converted into higher frequency components. Thus, portions which are delayed on the first half of the transmission path are no longer delayed as they reach the last half of the transmission path, thus compensating for the deterioration of the signal waveforms at the receiving side.

Four-wave mixing or light parametric amplification are used to achieve a non-linear optical effect. In this connection, for example, Henmi has filed a patent application of a device utilizing non-degenerate four-wave mixing of a semiconductor laser amplifier (Japanese Published Patent Application 1-263678, 1989). "Non-degenerate four-wave mixing" means that a pump light and a probe light (here corresponding to the input signal light) having a frequency different from that of the pump light are simultaneously incident on a non-linear optical medium. The output signal light contains spectra which include inverted probe light spectra on a frequency axis generated at symmetrical positions to the probe light relative to the pump light frequency.

The non-degenerate four-wave mixing of a semiconductor laser or a semiconductor laser amplifier is produced by two different mechanisms. One mechanism is due to carrier density modulation wherein frequency conversion is higher but frequency response is limited by the life time (about 1 ns) of a carrier. Therefore, signal light transmission speed to be converted is as low as about 1 Gb/s. Another mechanism is due to an intraband non-linear process which has a lower frequency conversion efficiency but exhibits a higher frequency response of several hundred GHz or more. Therefore, signals with 100 Gb/s or more may theoretically be converted. The latter mechanism, however, has very low frequency conversion efficiency. As a result, the former four-wave mixing mechanism caused by the carrier density modulation is widely used in conventional examples.

However, problems arise with the conventional examples. One problem is that, in order to utilize a non-linear optical effect, such as the four-wave mixing or the light parametric amplification, the pump light source requires a very large output. For example, utilization of optical fiber as a non-linear optical medium requires a pump light source of several watts or above. For this reason, laser devices, such as solid laser devices, are required for dispersion-compensating devices. However, it is difficult to use these devices for optical fiber transmission in view of their power consumption and stability. A very large output of the pump light source is necessary because of a lack of non-linear optical medium with high efficiency and capable of operating with a lower output pump light source of several tens of mW or below. The only exception is the use of the non-degenerate four-wave mixing of the semiconductor laser amplifier as described in the conventional example. In this case, a pump light source with 1 mW or less is used to obtain a high efficiency frequency conversion. However, because the conventional fourwave mixing caused by modulation of carrier density has a lower speed response, high speed signals with 1 Gb/s or above are difficult to frequency convert. If the four-wave mixing caused by the intraband nonlinear process is used, a higher speed signal must be converted. Because the conversion efficiency is extensively lower, a dispersive compensating device utilizing such phenomenon has not been realized to date.

SUMMARY OF THE INVENTION

An object of the present invention is to solve these problems and to provide an optical fiber dispersion-compensating device exhibiting stability with lower power consumption and capable of compensating waveform deterioration caused by frequency dispersion of high speed signals of several Gb/s or above.

The optical fiber dispersion-compensating device in accordance with the present invention includes a pump light source for generating a pump light signal having a first frequency and injection means for injecting both the pump light signal and an input light signal having a second frequency different from the first frequency. A non-linear optical medium means is included for receiving the input light signal and the pump light signal from the injection means for frequency converting the input light signal to generate an output light signal having a third frequency differing from the first and second frequencies using non-degenerate four-wave mixing. The non-linear optical medium means includes a Fabry-Perot type semiconductor laser having an oscillation mode and a plurality of resonance modes wherein the first frequency substantially coincides with the oscillation mode and wherein the second frequency substantially coincides with one of the plurality of resonance modes. A take-out means is also provided for taking out the output light signal.

The device includes injection means for injecting an input light signal having a first frequency and a non-linear optical medium means for receiving the input light signal from the injection means, for frequency converting the input light signal using non-degenerate four-wave mixing, for amplifying the input light signal using resonance, and for generating an output light signal having a second frequency lower than the first frequency, the first frequency substantially coinciding with a resonance mode of the non-linear optical medium means. A take-out means is also provided for taking out the output light signal.

Non-degenerate four-wave mixing of a semiconductor laser or a semiconductor laser amplifier is produced by two different mechanisms. One mechanism is due to carrier density variation wherein light 30, signal transmission speed to be converted is as low as about 1 GHz. Another mechanism is due to the intraband non-linear process having lower frequency efficiency but exhibiting a response time of several hundred GHz or above.

The utilization of an intraband non-linear process of the semiconductor laser, which has not been conventionally used, allows for dispersion-compensation of high speed light signals having a frequency of several Gb/s or above. FIG. 2 typically indicates detuning frequency dependency of output signal light intensity in the non-degenerate four-wave mixing of a traveling wave-type semiconductor laser amplifier. "Detuning frequency" means a difference between input signal light frequency and pump light frequency. The portion caused by modulation or carrier density is shown by a dotted line and the portion caused by an intraband non-linear process is shown by a solid line. Output signal light intensity is substantially constant in the frequency range from one hundred GHz to several hundreds of GHz, the values of which are negligible for the foregoing. Therefore, spectra of the input signal light are frequency converted back using the four-wave mixing in the range of the detuning frequency. Thus, theoretically, a frequency conversion of high speed signals with 100 GB/s or above, i.e., the dispersion-compensation, becomes possible.

The four-wave mixing caused by the intraband non-linear process of the semiconductor laser or semiconductor laser amplifier has a very low efficiency for frequency conversion, higher frequency of the output signal light does not exhibit satisfactorily, and the four-wave mixing is impossible to use for the dispersion-compensating device without modification. Accordingly, in the present invention, in order to greatly upgrade frequency conversion efficiency, the output signal light is amplified using resonance by the semiconductor laser with a resonance mode as a non-linear optical medium.

A concrete method will be explained referring to FIG. 3 which typically indicates resonance modes, pump light, input signal light, and output light relating to frequencies with respect to an FP semiconductor laser. The resonance modes are aligned substantially at an even interval on a frequency axis as in FIG. 3(a). The frequency of the pump light is synchronized and injected into one of the resonance modes of the semiconductor laser. Thus, only the resonance mode of the semiconductor laser is emphasized and oscillated in a single axis mode (i.e., forming injection locking status). Here, frequency of the input signal light is synchronized and injected into one of the other resonance modes. The output signal light which is returned (that is, frequency converted) to the position of a resonance mode is exactly symmetrical to the pump light frequency, as shown in FIG. 3(b), and is generated by the process of the non-degenerate four-wave mixing in which the oscillating light is used as pump light and the input signal light is used as probe light. The output signal light is amplified by one digit or more by resonance, resulting in higher intensity. In the utilization of resonance, as in the present invention, the four-wave mixing may advantageously be generated at a relatively lower power due to an internal electric field enlarged by confining the pump light and input signal light into a resonator. The arrangement using the semiconductor laser as a non-linear optical medium provides a smaller size with stable operation.

Although the resonance modes to be used must be within a gain-band of the semiconductor laser, this is not a burdensome limitation since the semiconductor laser ordinarily has a frequency gain band of several thousand GHz. The maximum value of detuning frequency is a resonance mode position at a frequency apart from the frequency to be used and must be selected at about 1000 GHz or below from the pump light frequency. This value is determined depending on response time of the intraband non-linear process of the semiconductor laser. The minimum value of detuning frequency is determined by the frequency interval of the resonance mode (ordinarily about 100 to 200 GHz). The detuning frequency interval is inversely proportional to a length of the resonator of the semiconductor laser and may be adjusted by suitably setting the resonator length. The output signals are amplified using resonance according to the invention and, hence, a frequency band limitation due to resonance determines the upper limit of signal speed to be dispersion-compensated. For this band, the resonator length of the semiconductor laser, end surface reflectivity, and inside gain are adjustable to obtain a bandwidth on the order of several tens of GHz and capable of compensating frequency dispersion of higher speed signals of about 10 Gb/s.

The dispersion-compensating device containing the non-linear optical medium is arranged at the intermediate position of an optical fiber transmission path having substantially uniform frequency dispersion characteristics. The spectrum of output signal light has a form in which the spectrum of the input signal light is converted to the frequency of pump light. Accordingly, influence of frequency dispersion of a transmission path on the transmitting side is compensated at a receiving side transmission path. The output signal light is converted back on the spectrum and transmitted to the receiving side. From this process, a signal wave-form substantially without deterioration by frequency dispersion may be received at the receiving end. In this device, the output signal light has a center frequency different by several hundred GHz from that of the input light. However, this problem is avoided on the transmission path by some positional adjustment of location of the dispersion-compensating device. More specifically, the dispersion-compensating device may preferably be arranged at a position where a total dispersion at a center frequency of the input signal light of the transmission path at the transmitting side may be equal to another total dispersion at a center frequency of the output signal light of the transmission path at the receiving side.

BRIEF DESCRIPTION OF THE DRAWINGS

FIG. 1 is a block diagram of a first embodiment of an optical fiber dispersion-compensating device according to the present invention.

FIG. 2 is a diagram showing detuning frequency dependency of output signal light intensity on a process of non-degenerate four-wave mixing.

FIG. 4 is a block diagram of a second embodiment of an optical fiber dispersion-compensating device according to the present invention.

PREFERRED EMBODIMENTS OF THE INVENTION

Figure 3A:
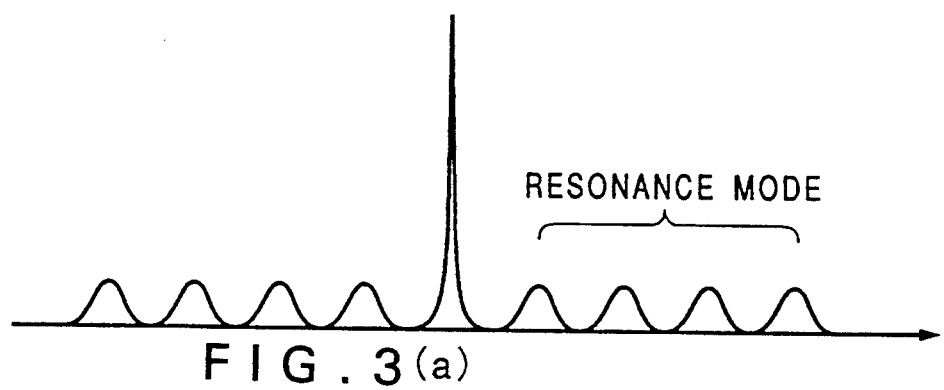
FIG. 3 is a diagram showing a resonance mode, pump light, input signal light, and output signal light relating to frequency with respect to an FP laser.
Figure 3B:
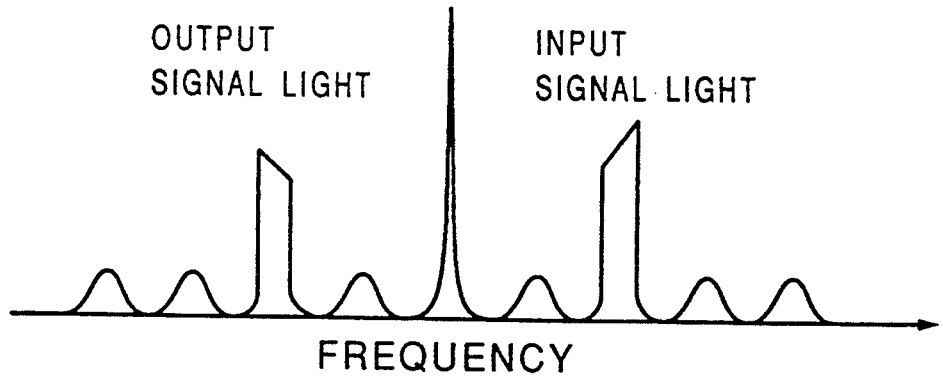

Preferred embodiments of an optical fiber dispersion-compensating device in accordance with the present invention will hereinafter be described in detail with reference to the accompanying drawings.

FIG. 1 is a block diagram of a first embodiment according to the present invention typically showing a basic construction of an optical fiber dispersion-compensating device. The optical fiber dispersion-compensating device is essentially comprised of an FP laser 10 of a non-linear optical medium, a pump laser 20, a frequency filter 30, an optical fiber amplifier 40, a polarization-compensating device 50, an optical isolator 60, and an optical system for connection thereof. A spectrum of input signal light deteriorated by frequency dispersion from a transmission line 200 on the transmitting side is converted back, i.e., frequency converted, on a frequency axis using non-degenerate four-wave mixing of the FP laser 10 and is output as output signal light to a transmission line 300 on the receiving side. The operational principle is as hereinbefore described.

A semiconductor laser with a 1.55 μm band is used as an FP laser 10 and a distributed feedback semiconductor laser (hereinafter referred to as a DFB laser) with a 1.55 μm band is used as a pump laser 20. The two lasers are temperature-stabilized within ±0.1° C. or less. A resonance mode of the FP laser 10 and the frequency of the pump laser 20 are respectively adjusted by temperature control. The frequency of the output signal light may be changed with a variation of the frequency of the pump laser 20 and with variation of an oscillation mode of the FP laser 10. The frequency filter 30 is for removing output signal light from the FP laser 10 and, in this arrangement, an FP interference-type filter is used. The optical fiber amplifier 40 amplifies a converted output signal light to deliver it to a transmission line. The optical fiber amplifier 40 uses an erbium doped optical fiber by semiconductor laser excitation. The polarization compensating device 50 applies pressure to the optical fiber to adjust polarization of input signal light and is comprised of a stress-applying section, a monitor section, a control section, and the like.

FIG. 4 is a block diagram of a second embodiment according to the present invention typically showing a basic construction of an optical fiber dispersion-compensating device. The second embodiment differs from the first embodiment by utilizing, as a non-linear optical medium, a semiconductor laser 11 (hereinafter referred to as a single mode laser) with a plurality of resonance modes capable of single axis mode oscillation. The remaining structure is substantially the same as the first embodiment. In this device, light itself of an oscillation mode of the single mode laser 11 is used as pump light. Thus, the pump light source as arranged in the first embodiment if not required. Accordingly, the device is simplified. In this arrangement, frequency of the single mode laser 11 and the operational principle is the same as the first embodiment. For the single mode laser 11, lasers which have single axis mode oscillation are used, such as an ordinary FP laser, a DFB laser, a distributive Bragg reflection type semiconductor laser, or a composite resonance type semiconductor laser and the like.

Figure 5A:
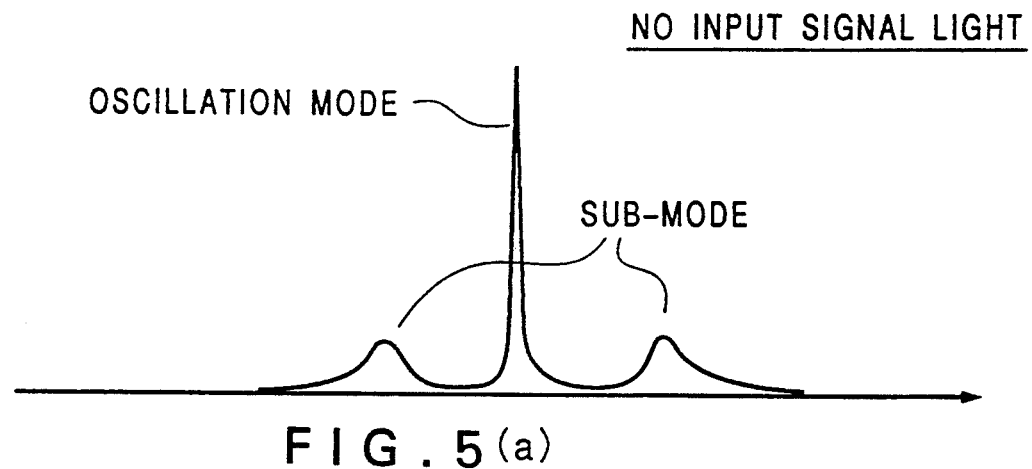
FIG. 5 is a diagram showing output spectra for pump light, input signal light, and output signal light relating to frequency with respect to a distributed feedback semiconductor laser (DFB laser).
Figure 5B:
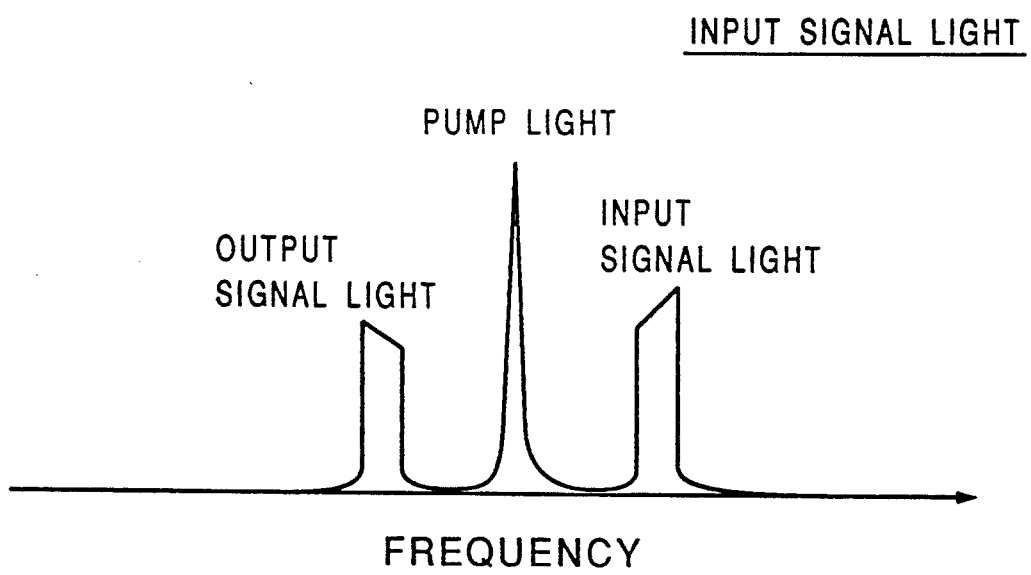

FIG. 5 is a diagram showing typical output spectra when using the DFB laser. More particularly, FIG. 5 shows pump light, input signal light, and output signal light, each relating to frequency. A so-called λ/4 shift type DFB laser is used as a DFB laser. In this λ/4 shift type DFB laser, a sub-mode is present at the symmetrical positions of both sides of a central oscillation mode, as in FIG. 5(a). The signal lights at the positions of the sub-modes are amplified by resonance as in a resonance mode of the Fabry-Perot type. When the input signal is injected to a position of one of the sub-modes in the oscillation state, output signal light with a spectrum frequency converted back on a frequency axis at the position on one sub-mode opposite to the pump light, i.e., oscillation light, as shown in FIG. 5(b), is generated by the process of non-degenerate four-wave mixing. This output signal light is amplified by resonance and, thus, produces a great intensity. A frequency interval of the oscillation mode and the sub-mode is normally about 100 to 200 GHz or above. Only the output signal light may be taken out by the frequency filter 30. A resonance frequency band may be adjusted by varying resonator length or a coupling coefficient of the diffraction grating of the λ/4 shift type DFB laser. A frequency band of the DFB laser is on the order of several tens of GHz.

The λ/4 shift type DFB laser is ordinarily non-reflectively coated at both ends. However, a laser having a reflectivity of several percent has a resonance mode, as in the FP laser, on both sides of the sub-modes, as shown in FIG. 5. This indicates that it is possible to use these resonance modes. The same results are obtained in the semiconductor laser having the other construction hereinbefore described using a single mode laser.

Figure 6:
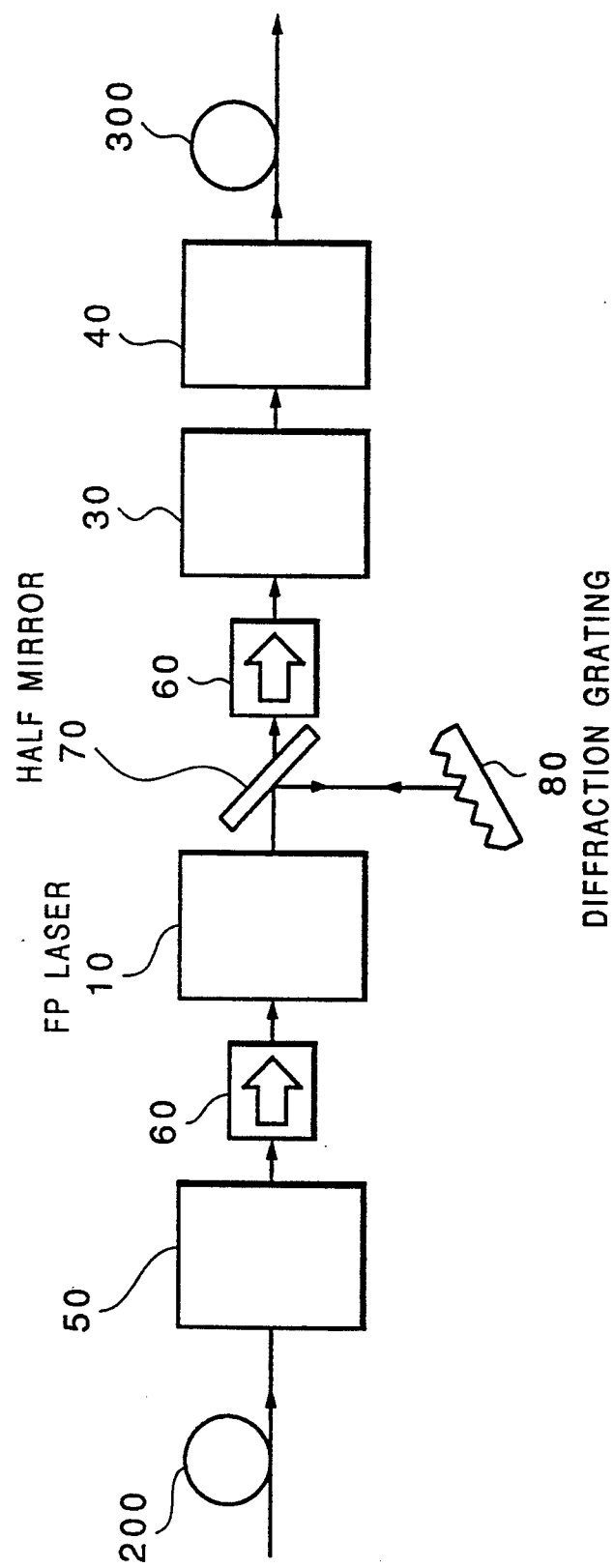
FIG. 6 is a block diagram of a third embodiment of an optical fiber dispersion-compensating device according to the present invention.

FIG. 6 is a block diagram of a third embodiment according to the present invention typically showing a basic construction of an optical fiber dispersion-compensating device. One difference from the first embodiment is a means for single axis mode oscillating by selectively feeding back light of a specific resonance mode from among a plurality of resonance modes using an FP laser 10 as a non-linear optical medium. The other components are substantially the same as the first embodiment. In the device, light itself of the oscillation mode may be used as pump light, as in the second embodiment. The pump laser as arranged in the first embodiment is not necessary. Thus, the device construction is simplified. The operational principle is entirely the same as the first embodiment. A diffraction grating 80 is used as a means for feeding back a specific resonance mode.

A half mirror 70 is introduced for taking out an output signal light from the FP laser 10.

While the preferred embodiment in accordance with the present invention has been fully described, some supplemental explanation is provided below. In the embodiments, only the device corresponding to the 1.55 μm band as a wavelength band of signal light has been shown and described. However, by varying the wavelength of the semiconductor laser and the pump light source to the non-linear optical medium, the same effect may be obtained for a signal light with another wavelength band, for example, a 1.3 μm band, etc. The device according to the present invention may be effectively applied as a modulating and demodulating system of signal light not only in a direct detecting system but also in another method, such as a coherent system. The frequency filter 30 and the fiber amplifier 40 of the embodiments may be omitted depending on a transmission line. The polarized wave compensating device 50 is not necessary in the arrangement where a polarized wave storage is used as a transmission line or in the transmission line where a polarization variation is negligible.

In the arrangement capable of amplifying by resonance according to the present invention, the output signal light may be taken out from any of two resonator faces of a semiconductor laser of a non-linear optical medium. Therefore, in addition to the arrangement according to the embodiments, for example, an arrangement capable of injecting pump light and input signal light from an output side resonator face may be utilized by suitably changing an optical system.

As hereinbefore fully described according to the present invention, there may be realized a stable optical fiber dispersion-compensating device with lower electric power consumption capable of compensating wave deterioration due to dispersion of high speed signals with several Gb/s or above.

What is claimed is:

1. An optical fiber dispersion-compensating device comprising:
   a pump light source for generating a pump light signal having a first frequency;
   injection means coupled to an optical fiber for injecting both the pump light signal and an input light signal having a second frequency different from the first frequency;
   non-linear optical medium means for receiving the input light signal and the pump light signal from the injection means, for frequency converting the input light signal to generate an output light signal having a third frequency differing from the first and second frequencies using non-degenerate four-wave mixing, the non-linear optical medium means including a Fabry-Perot type semiconductor laser having an oscillation mode and a plurality of resonance modes, wherein the first frequency substantially coincides with the oscillation mode and wherein the second frequency substantially coincides with one of the plurality of resonance modes; and
   take-out means for taking out the output light signal.

2. The optical fiber dispersion-compensating device of claim 1 wherein the third frequency is less than the first an d second frequencies.

3. An optical fiber dispersion-compensating device comprising:
   injection means coupled to an optical fiber for injecting an input light signal having a first frequency;
   non-linear optical medium means for receiving the input light signal, for frequency converting the input light signal to generate an output light signal having a second frequency different than the first frequency using non-degenerate four-wave mixing and for providing a plurality of resonance modes, the non-linear optical medium means including a semiconductor laser for single axis mode oscillation having an oscillation frequency different from the first or second frequencies and having a resonance mode substantially coinciding with the first frequency;
   take-out means for taking out the output signal light.

4. The optical fiber dispersion-compensating device of claim 3 wherein the second frequency is less than the first frequency.

5. An optical fiber dispersion-compensating device comprising:
   injection means coupled to an optical fiber for injecting an input light signal having a first frequency;
   non-linear optical medium means for receiving the input light signal from the injecting means and for frequency converting the input light signal to generate an output light signal having a second frequency different from the first frequency using non-degenerate four-wave mixing, the non-linear optical medium means including a Fabry-Perot type semiconductor laser having a first resonance mode substantially coinciding with the first frequency and a second resonance mode substantially coinciding with the second frequency;
   take-out means for taking out the output signal light;
   oscillation means for single axis mode oscillation for selectively feeding back light of the second resonance mode of the Fabry-Perot type semiconductor laser; and
   take-out means for taking out the output light signal.

6. The optical fiber dispersion-compensating device of claim 5 wherein the second frequency is less than the first frequency.

7. An optical fiber dispersion-compensating device comprising:
   injection means coupled to an optical fiber for injecting an input light signal having a first frequency;
   non-linear optical medium means: for receiving the input light signal form the injection means, for frequency converting the input light signal using non-degenerate four-wave mixing, for amplifying the input light signal using resonance, and for generating an output light signal having a second frequency lower than the first frequency, the first frequency substantially coinciding with a resonance mode of the non-linear optical medium means; and
   take-out means for taking out the output light signal.

* * * * *